(12) United States Patent
Yang

(10) Patent No.: US 11,297,210 B2
(45) Date of Patent: Apr. 5, 2022

(54) CAMERA MODULE, METHOD FOR ASSEMBLING CAMERA MODULE, AND MOBILE TERMINAL

(71) Applicant: VIVO MOBILE COMMUNICATION CO., LTD., Guangdong (CN)

(72) Inventor: Jun Yang, Chang'an Dongguan (CN)

(73) Assignee: VIVO MOBILE COMMUNICATION CO., LTD., Chang'an Dongguan (CN)

( * ) Notice: Subject to any disclaimer, the term of this patent is extended or adjusted under 35 U.S.C. 154(b) by 0 days.

(21) Appl. No.: 16/966,325

(22) PCT Filed: Jan. 25, 2019

(86) PCT No.: PCT/CN2019/073169
§ 371 (c)(1),
(2) Date: Jul. 30, 2020

(87) PCT Pub. No.: WO2019/149149
PCT Pub. Date: Aug. 8, 2019

(65) Prior Publication Data
US 2020/0374425 A1 Nov. 26, 2020

(30) Foreign Application Priority Data
Jan. 30, 2018 (CN) .......................... 201810090181.X

(51) Int. Cl.
*H04N 5/225* (2006.01)
*H04M 1/02* (2006.01)
(52) U.S. Cl.
CPC ........ *H04N 5/2252* (2013.01); *H04M 1/0264* (2013.01); *H04N 5/2253* (2013.01); *H04N 5/2257* (2013.01)

(58) Field of Classification Search
CPC ..... H04N 5/2251–2253; H04N 5/2257; H04N 5/2258; H04M 1/0264
(Continued)

(56) References Cited

U.S. PATENT DOCUMENTS 7,405,764 B2 7/2008 Gustavsson et al.
2006/0006511 A1 1/2006 Roh et al.
(Continued)

FOREIGN PATENT DOCUMENTS

CN 1719590 A 1/2006
CN 101071781 A 11/2007
(Continued)

OTHER PUBLICATIONS

EP Search Report in Application No. 19747844.9 dated Jan. 26, 2021.
(Continued)

*Primary Examiner* — Anthony J Daniels
(74) *Attorney, Agent, or Firm* — Maschoff Brennan

(57) ABSTRACT

A camera module, a method for assembling the camera module, and a mobile terminal are provided. The camera module includes a flexible circuit board; a chip, stacked on the flexible circuit board; an image sensor, stacked on the chip; a connection wire, where one end of the connection wire is connected to a wiring region of the flexible circuit board, the other end of the connection wire is connected to an interface region of a first surface of the chip, and the first surface is a surface of the chip away from the flexible circuit board; and a first protective structure, arranged on the interface region of the first surface of the chip.

9 Claims, 2 Drawing Sheets

(58) Field of Classification Search
USPC .......................................................... 348/374
See application file for complete search history.

(56) References Cited

U.S. PATENT DOCUMENTS

| | | | |
|---|---|---|---|
| 2007/0223913 A1 | 9/2007 | Lee | |
| 2008/0191335 A1 | 8/2008 | Yang et al. | |
| 2008/0246845 A1 | 10/2008 | Chan | |
| 2008/0297645 A1 | 12/2008 | Lo et al. | |
| 2009/0166784 A1* | 7/2009 | Honda | H01L 27/14625 257/432 |
| 2010/0164082 A1* | 7/2010 | Fujisawa | H01L 27/14618 257/680 |
| 2011/0272773 A1 | 11/2011 | Kazama | |
| 2012/0104536 A1 | 5/2012 | Seo et al. | |
| 2014/0170797 A1* | 6/2014 | Ho | H01L 24/97 438/65 |
| 2017/0271390 A1 | 9/2017 | Wang et al. | |
| 2017/0331994 A1* | 11/2017 | Ida | G02B 27/62 |
| 2019/0165019 A1 | 5/2019 | Wang et al. | |
| 2019/0263040 A1* | 8/2019 | Wang | H04N 5/2251 |
| 2019/0326339 A1* | 10/2019 | Dong | G06K 9/00013 |
| 2020/0007726 A1* | 1/2020 | Wang | G03B 17/12 |
| 2020/0057902 A1* | 2/2020 | Kim | G06K 9/00013 |
| 2021/0185192 A1* | 6/2021 | Gong | H01L 27/146 |

FOREIGN PATENT DOCUMENTS

| | | | |
|---|---|---|---|
| CN | 101315454 A | 12/2008 | |
| CN | 101315939 A | 12/2008 | |
| CN | 201673907 U | 12/2010 | |
| CN | 104580855 A | 4/2015 | |
| CN | 204856463 U | 12/2015 | |
| CN | 105845654 A | 8/2016 | |
| CN | 107071252 A | 8/2017 | |
| CN | 107301988 A | 10/2017 | |
| CN | 107395938 A | 11/2017 | |
| CN | 107588333 A | 1/2018 | |
| CN | 108134898 A | 6/2018 | |
| JP | 2005079499 A | 3/2005 | |
| JP | 2011-238667 A | 11/2011 | |
| JP | 2012-095177 A | 5/2012 | |
| WO | WO-2015176601 A1 * | 11/2015 | H01L 27/146 |
| WO | 2017/166798 A | 10/2017 | |

OTHER PUBLICATIONS

CN Office Action in Application No. 201810090181.X dated Jun. 6, 2019.
CN Search Report in Application No. 201810090181.X dated Nov. 15, 2018.
Written Opinion and International Search Report in Application No. PCT/CN2019/073169 dated Aug. 13, 2020.
KR Office Action dated May 21, 2021 as received in Application No. 10-2020-7022712.

* cited by examiner

CAMERA MODULE, METHOD FOR ASSEMBLING CAMERA MODULE, AND MOBILE TERMINAL

CROSS-REFERENCE TO RELATED APPLICATION

This application is the U.S. national phase of PCT Application No. PCT/CN2019/073169 filed on Jan. 25, 2019, which claims a priority to Chinese Patent Application No. 201810090181.X filed on Jan. 30, 2018, both disclosures of which are incorporated in their entireties by reference herein.

TECHNICAL FIELD

The present disclosure relates to the technical field of communications, in particular to a camera module, a method for assembling the camera module, and a mobile terminal.

BACKGROUND

With the development and popularization of full view display of smart phones, the thickness of the mobile phone has become thinner and thinner, and the space available for a camera module inside the mobile phone has become smaller and smaller. Therefore, it is required to reduce the size of the camera module.

In the related art, in order to reduce the thickness of the camera module, a camera lens holder inside the camera module is omitted to achieve the effect of reducing the thickness of the camera. Referring to FIG. 1, after the camera lens holder is omitted, in order to protect a gold wire B, in the related art, plastics C are injected to the periphery of the gold wire B through a plastic injection mold D to ensure that the gold wire B is not exposed. A problem in the related art lies in that when plastic injection molding is performed, because a contact area between the plastic injection mold D and a chip A is small (at a position E in FIG. 1), a force bearing area on the chip A for withstanding a pressure exerted by the plastic injection mold D is small, which may easily cause the chip A to be cracked at a position of the chip A in direct contact with the plastic injection mold D, after being subjected to a relatively large pressure, thereby causing a failure to the entire camera module.

SUMMARY

Embodiments of the present disclosure provide a camera module, a method for assembling the camera module and a mobile terminal, to solve a problem that a chip is cracked or a failure occurs to a camera module due to a small contact area between a plastic injection mold and the chip.

In a first aspect, an embodiment of the present disclosure provides a camera module, including:
  a flexible circuit board;
  a chip, stacked on the flexible circuit board;
  an image sensor, stacked on the chip;
  a connection wire, where one end of the connection wire is connected to a wiring region of the flexible circuit board, the other end of the connection wire is connected to an interface region of a first surface of the chip, and the first surface is a surface of the chip away from the flexible circuit board; and
  a first protective structure, arranged on the interface region of the first surface of the chip.

In a second aspect, an embodiment of the present disclosure further provides a mobile terminal, which includes the above camera module.

In a third aspect, an embodiment of the present disclosure further provides a method for assembling a camera module, which includes:
  stacking the chip on the flexible circuit board;
  stacking the image sensor on the chip;
  connecting one end of the connection wire to the flexible circuit board and the other end of the connection wire to the first surface of the chip; and
  arranging the first protective structure on the first surface of the chip, to enable a portion of the connection wire protruding in a direction away from the first surface to be located inside the first protective structure.

Therefore, in the above solutions of the present disclosure, by adding the first protective structure in the camera module, the contact area with the chip is increased, so that a force bearing area on the chip for withstanding a pressure applied by a plastic injection mold is increased, which can prevent the chip from being cracked and ensure the camera to operate normally.

BRIEF DESCRIPTION OF THE DRAWINGS

In order to more clearly explain technical solutions of embodiments of the present disclosure, drawings required for the description of the embodiments of the present disclosure will be briefly described below. Obviously, the drawings in the following description are only some embodiments of the present disclosure, and for those of ordinary skill in the art, other drawings can be obtained based on these drawings without creative efforts.

DETAILED DESCRIPTION

Figure 1:
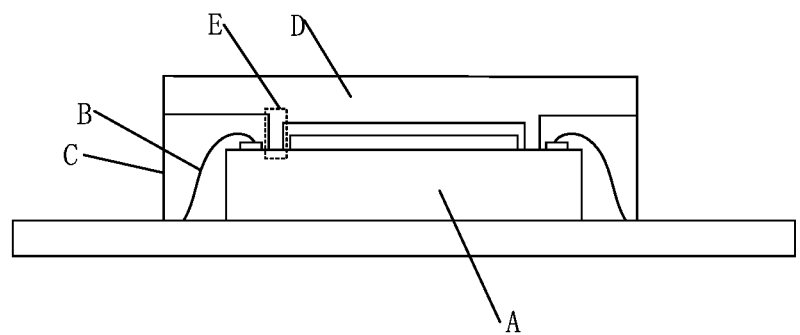
FIG. 1 shows a schematic structural diagram of a camera module in a case that a plastic injection molding is performed by using a plastic injection mold in the related art.

Exemplary embodiments of the present disclosure will be described in more detail below with reference to the accompanying drawings. Although the exemplary embodiments of the present disclosure are shown in the drawings, it should be understood that the present disclosure may be implemented in various forms and should not be limited by the embodiments set forth herein. Conversely, these embodiments are provided in order to enable a more thorough understanding of the present disclosure and to fully convey the scope of the present disclosure to those of ordinary skill in the art.

Figure 2:
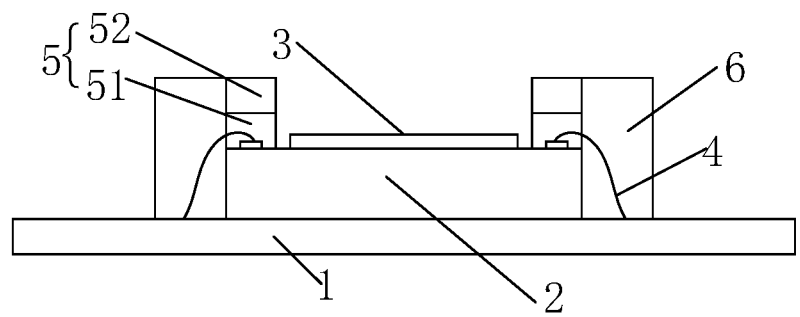
FIG. 2 shows a schematic structural diagram of a camera module according to an embodiment of the present disclosure.
Figure 3:
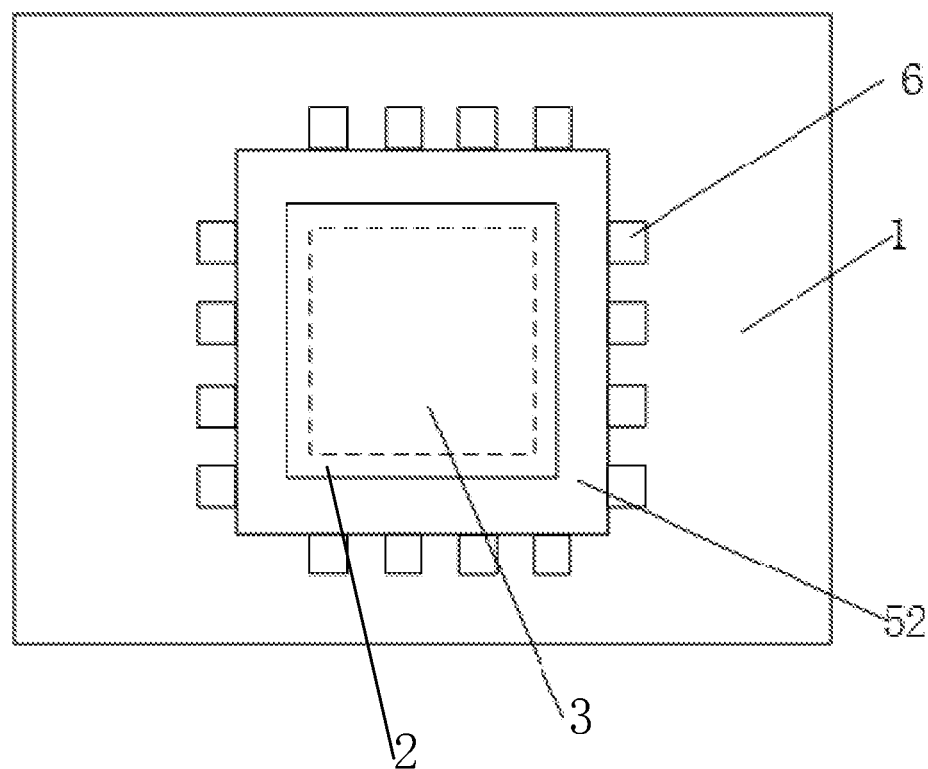
FIG. 3 shows a schematic structural diagram of a camera module according to an embodiment of the present disclosure.
Figure 4:
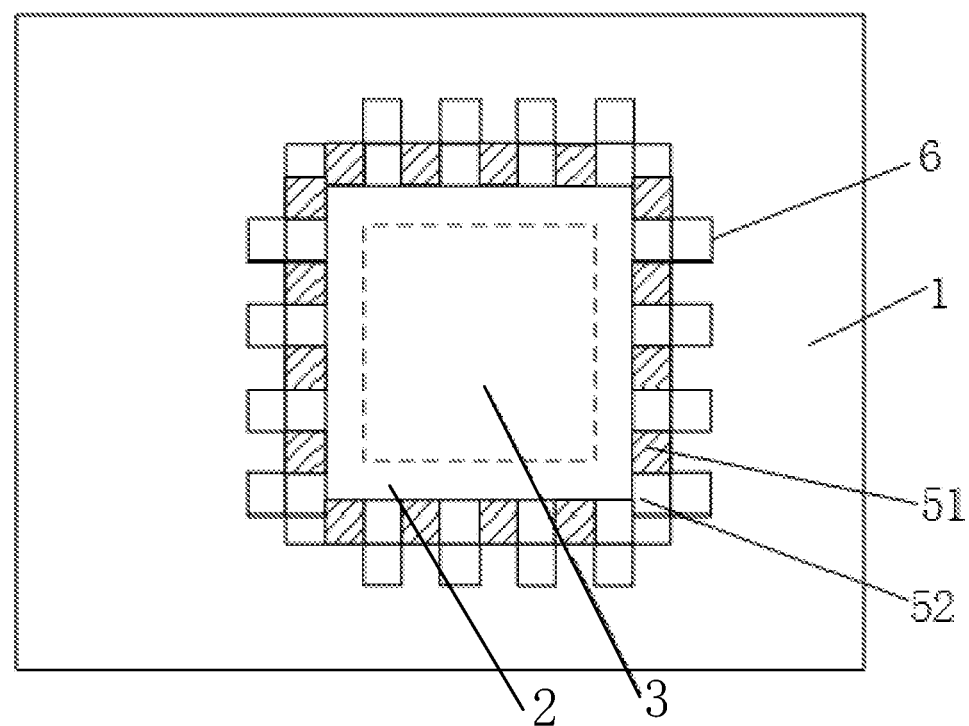
FIG. 4 is a schematic structural diagram of a camera module according to an embodiment of the present disclosure.

Referring to FIG. 2 to FIG. 4, a camera module is provided according to embodiments of the present disclosure. The camera module includes: a flexible circuit board 1; a chip 2, stacked on the flexible circuit board 1; an image sensor 3, stacked on the chip 2; a connection wire 4, where one end of the connection wire 4 is connected to a wiring region of the flexible circuit board 1, the other end of the connection wire 4 is connected to an interface region of a first surface of the chip 2, and the first surface is a surface of the chip 2 away from the flexible circuit board 1; and a first protective structure 5, arranged on the interface region of the first surface of the chip. A portion of the connection wire 4 protruding in a direction away from the first surface is located inside the first protective structure 5.

In the embodiments of the present disclosure, since the first protective structure 5 is added in the camera module, a contact area with the chip 2 is increased, so that a force bearing area on the chip 2 for withstanding a pressure applied by a plastic injection mold is increased, which can prevent the chip 2 from being cracked and ensure the camera to operate normally. Additionally, since a camera lens holder is eliminated, the size of the camera module becomes smaller, which achieves the effect of reducing the thickness of the mobile terminal.

Further, in an embodiment of the present disclosure, referring to FIG. 3, the number of the connection wires 4 is plural, the first protective structure 5 is formed as a frame-shaped structure on the first surface of the chip 2, and a portion of each of the plurality of connection wires 4 protruding in a direction away from the first surface is located inside the first protective structure 5.

The image sensor 3 is exposed from a hollow part of the first protective structure 5, so that a light ray collected by a camera lens of the camera module can be projected to the image sensor 3, the image sensor 3 converts an optical signal into an electrical signal, and an image is further formed by the chip 2.

Further, in an embodiment of the present disclosure, referring to FIG. 2 to FIG. 4, the camera module further includes: a second protective structure 6, arranged in the wiring region on the flexible circuit board 1, and a portion of the connection wire 4 protruding in a direction away from a side surface of the chip 2 is arranged inside the second protective structure 6.

The second protective structure 6 is made of plastic, which is formed by injection-molding plastics through a plastic injection mold arranged on the first protective structure 5 to the portion of the connection wire 4 protruding in the direction away from the side surface of the chip 2. The second protective structure 6 is arranged in close contact with the side surface of the chip 2. As shown in FIG. 2, in an embodiment of the present disclosure, the second protective structure 6 is a cuboid-shaped structure.

The first protective structure 5 clads the portion of the connection wire 4 protruding in the direction away from the first surface, and the second protective structure 6 clads a portion of the connection wire 4 protruding in the direction away from the side surface of the chip 2, so that the connection wire 4 will not be exposed. Therefore, the camera lens holder in the camera module can be omitted, and the size of the camera module can be decreased while ensuring a failure not to occur to a connection between the connection wire 4 and the chip 2 or a connection between the connection wire 4 and the flexible circuit board 1.

Further, referring to FIG. 2 and FIG. 3, in an embodiment of the present disclosure, the first protective structure 5 and the second protective structure 6 are snugly connected.

Since the second protective structure 6 is injection-molded on the flexible circuit board 1 by using a plastic injection molding process, after the second protective structure 6 is injection-molded on the flexible circuit board 1, the second protective structure 6 is attached to the first protective structure 5, so as to achieve a fixed connection between the two structures. The first protective structure 5 and the second protective structure 6 are snugly connected, so that the connection wire 4 can be completely surrounded.

Furthermore, in an embodiment of the present disclosure, referring to FIG. 2, a surface of the second protective structure 6 away from the flexible circuit board 1 and a surface of the first protective structure 5 away from the chip 2 are located on a same surface.

The surface of the second protective structure 6 away from the flexible circuit board 1 and the surface of the first protective structure 5 away from the chip 2 are arranged on the same surface, which facilitates the installation of a camera lens of the camera module.

Furthermore, in an embodiment of the present disclosure, referring to FIG. 3 and FIG. 4, a predetermined distance is provided between an orthographic projection of the first protective structure 5 onto the chip 2 and an orthographic projection of the image sensor 3 onto the chip 2.

Such setting is to prevent the image sensor 3 from being pressed by the plastic injection mold during the plastic injection molding of the second protective structure 6 to cause the image sensor 3 to be broken, so as to ensure the structural integrity of the image sensor 3.

Furthermore, in an embodiment of the present disclosure, referring to FIG. 2, a side surface of the first protective structure 5 away from the image sensor 3 and the side surface of the chip 2 away from the image sensor 3 are located on a same surface.

The side surface of the first protective structure 5 away from the image sensor 3 and the side surface of the chip 2 away from the image sensor 3 are arranged on the same surface, which facilitates the plastic injection molding of the second protective structure 6.

Specifically, in an embodiment of the present disclosure, the first protective structure 5 may be arranged on the first surface of the chip 2 in two ways. Referring to FIG. 2, the first protective structure 5 in the first arrangement includes: a first protective layer 51 arranged on the first surface of the chip 2, where the portion of the connection wire 4 protruding in a direction away from the first surface is located inside the protective layer 51; and a second protective layer 52 attached onto a surface of the first protective layer 51 away from the chip 2. A hardness of the second protective layer 52 is larger than a hardness of the first protective layer 51.

In this case, the second protective layer 52 is made of ceramic material, silicon material, resin substrate material or epoxy glass fiber board material, and the first protective layer 51 is a double-sided adhesive. A material grade corresponding to the epoxy glass fiber board is FR4.

The first protective layer 51 is the double-sided adhesive, and a thickness of the double-sided adhesive is greater than a height of the portion of the connection wire 4 that protrudes in the direction away from the first surface, so as to ensure that the double-sided adhesive can clad the portion of the connection wire 4 protruding in the direction away from the first surface.

In this first implementation manner, referring to FIG. 3, the first protective layer 51 and the second protective layer 52 may be a frame-shaped structure, the image sensor 3 is exposed from a hollow part of the first protective layer 51 and the second protective layer 52, so that a light ray collected by a camera lens of the camera module can be projected to the image sensor 3.

Optionally, in the first implementation manner, the first protective layer 51 may be constructed as a frame-shaped structure, and the second protective layer 52 may be constructed as a cuboid-shaped structure. The number of the second protective layers 52 may be multiple, the multiple second protective layers 52 are evenly stacked on the first protective layer 51, and the multiple second protective layers 52 are distributed around a center line of the frame-shaped structure. The multiple connection wires 4 are respectively cladded inside the first protective layer 51.

Optionally, in the first implementation manner, the second protective layer 52 may be constructed as a frame-shaped structure, and the first protective layer 51 may be constructed as a cuboid-shaped structure. The number of the first protective layers 51 may be multiple, and the multiple first protective layers 51 are distributed around a center line of the frame-shaped structure, the second protective layer 52 is stacked on the multiple first protective layers 51, and each of the connection wires 4 corresponds to one of the first protective layers 51.

Moreover, in this first implementation manner, the second protective structure 6 is attached to the first protective layer 51 and the second protective layer 52. A surface of the second protective structure 6 away from the flexible circuit board 1 and a surface of the second protective layer 52 away from the chip 2 are located on a same surface. A side surface of the first protective layer 51 facing a side surface of the image sensor 3 and a side surface of the second protective layer 52 facing the side surface of the image sensor 3 are located on a same surface. A side surface of the first protective layer 51 away from the side surface of the image sensor 3 and a side surface of the second protective layer 52 away from the side surface of the image sensor 3 are located on a same surface. There is a predetermined distance between each of orthographic projections of the first protective layer 51 and the second protective layer 52 onto the chip 2 and an orthographic projection of the image sensor 3 onto the chip 2.

By arranging the portion of each connection wire 4 protruding in the direction away from the first surface inside the first protective layer 51, the connection wire 4 can be prevented from being exposed, and the connection wire 4 can be ensured to be fixedly connected to a welding spot of the chip 2. Additionally, since the second protective layer 52 arranged on the first protective layer 51 increases the contact area with the chip 2, the force bearing area on the chip 2 for withstanding a pressure applied by a plastic injection mold increases, thereby avoiding the problem that the chip 2 is cracked and ensuring the camera to operate normally.

Referring to FIG. 4, further, in an embodiment of the present disclosure, the first protective structure 5 in the second arrangement includes: a first protective layer 51 arranged on the first surface of the chip 2, where the portion of the connection wire 4 protruding in a direction away from the first surface is located inside the protective layer 51; and a second protective layer 52 arranged on the first surface of the chip 2, where a surface of the second protective layer 52 away from the chip 2 is located above a surface of the first protection layer 51 away from the chip 2. A hardness of the second protective layer 52 is larger than a hardness of the first protective layer 51.

In this second implementation manner, the second protective layer 52 is made of ceramic material, silicon material, resin substrate material, or epoxy glass fiber board material, where a material grade corresponding to the epoxy glass fiber board is FR4. The first protective layer 51 may be a structure made of a flexible material such as plastic. Moreover, each of the first protective structure 5 and the second protective structure 6 is a cuboid-shaped structure.

In addition, in this second implementation manner, the side surface of the first protective layer 51 and the side surface of the second protective layer 52 may be attached to each other, or may not be attached.

That the surface of the second protective layer 52 away from the chip 2 is located above the surface of the first protective layer 51 away from the chip 2 means that a height of the first protective layer 51 is lower than a height of the second protective layer 52. In such manner, it can be ensured that when the second injection structure 6 is injection-molded by using a plastic injection mold, the first protective layer 51 cannot contact the plastic injection mold.

Moreover, in this second implementation manner, the second protective structure 6 is attached to the first protective layer 51 and the second protective layer 52. A surface of the second protective structure 6 away from the flexible circuit board 1 and a surface of the second protective layer 52 away from the chip 2 are located on a same surface. A side surface of the first protective layer 51 facing a side surface of the image sensor 3 and a side surface of the second protective layer 52 facing the side surface of the image sensor 3 are located on a same surface. A side surface of the first protective layer 51 away from the side surface of the image sensor 3 and a side surface of the second protective layer 52 away from the side surface of the image sensor 3 are located on a same surface. There is a predetermined distance between each of orthographic projections of the first protective layer 51 and the second protective layer 52 onto the chip 2 and an orthographic projection of the image sensor 3 onto the chip 2.

By arranging the portion of each connection wire 4 protruding in the direction away from the first surface inside the first protective layer 51, the connection wire 4 can be prevented from being exposed, and the connection wire 4 can be ensured to be fixedly connected to a welding spot of the chip 2. Additionally, since the second protective layer 52 provided on the first protective layer 51 increases the contact area with the chip 2, the force bearing area on the chip 2 for withstanding a pressure applied by a plastic injection mold increases, thereby avoiding the problem that the chip 2 is cracked and ensuring the camera to operate normally.

According to another aspect of the present disclosure, an embodiment of the present disclosure further provides a mobile terminal, including the above camera module.

In the mobile terminal of the present disclosure, by adding the first protective structure 5 in the camera module, the contact area with the chip 2 is increased, so that a force bearing area on the chip 2 for withstanding a pressure applied by a plastic injection mold is increased, which can prevent the chip 2 from being cracked and ensure the camera to operate normally.

According to another aspect of the present disclosure, the present disclosure further provides a method for assembling a camera module, including:

stacking the chip 2 on the flexible circuit board 1;

stacking the image sensor 3 on the chip 2;

connecting one end of the connection wire 4 to the flexible circuit board 1 and the other end of the connection wire 4 to the first surface of the chip 2; and arranging the first protective structure 5 on the first surface of the chip 2, to enable a portion of the connection wire 4 protruding in a direction away from the first surface to be located inside the first protective structure 5.

By adding a first protective structure 5 in the camera module, the contact area with the chip 2 is increased, so that the force bearing area on the chip 2 for withstanding a pressure applied by a plastic injection mold increases, thereby avoiding the problem that the chip 2 is cracked and ensuring the camera to operate normally.

Furthermore, in the embodiment of the present disclosure, the second protective structure 6 is injection-molded, with a plastic injection mold, on the portion of the connection wire 4 protruding in a direction away from a side surface of the chip 2, such that the second protective structure 6 is snugly connected to a surface of the flexible circuit board 1 arranged with the chip 2, and a portion of the connection wire 4 protruding in a direction away from the side surface of the chip 2 is arranged inside the second protective structure 6.

The first protective structure 5 clads the portion of the connection wire 4 protruding in the direction away from the first surface, and the second protective structure 6 dads the portion of the connection wire 4 protruding in the direction away from the side surface of the chip 2, so that the connection wire 4 will not be exposed. Therefore, the camera lens holder in the camera module can be omitted, and the size of the camera module can be decreased while ensuring a failure not to occur to a connection between the connection wire 4 and the chip 2 or a connection between the connection wire 4 and the flexible circuit board 1.

Various embodiments in this specification are described in a progressive manner. Each embodiment focuses on the differences from other embodiments, and the same or similar parts between the embodiments may refer to each other.

Although optional embodiments have been described according to the embodiments of the present disclosure, those skilled in the art can make additional changes and modifications to these embodiments once they learn the basic inventive concept. Therefore, the appended claims are intended to be interpreted as comprising the optional embodiments and all the changes and modifications falling within the scope of the embodiments of the present disclosure.

Finally, it should be noted that in this specification, relational terms such as first and second are used only to distinguish one entity or operation from another entity or operation, and do not necessarily require or imply that there exists any of such actual relationships or orders between these entities or operations. Moreover, terms "include", "comprise" or any other variant thereof are intended to cover non-exclusive inclusion, so that a process, method, article, or terminal device that includes a series of elements not only includes those elements, but also includes those that are not explicitly listed, or may further include elements inherent to such process, method, article, or terminal device. Without more restrictions, an element defined by the sentence "include one . . . " does not exclude that there are other identical elements in the process, method, article, or terminal device that includes the element.

The above embodiments are optional embodiments of the present disclosure. It should be noted that for those of ordinary skill in the art, several improvements and modifications can be made without departing from the principle described in the present disclosure, and these improvements and modifications shall also fall within the scope of the present disclosure.

What is claimed is:

1. A camera module, comprising:
   a flexible circuit board;
   a chip, stacked on the flexible circuit board;
   an image sensor, stacked on the chip;
   a connection wire, wherein one end of the connection wire is connected to a wiring region of the flexible circuit board, the other end of the connection wire is connected to an interface region of a first surface of the chip, and the first surface is a surface of the chip away from the flexible circuit board; and
   a first protective structure, arranged on the interface region of the first surface of the chip,
   wherein the first protective structure comprises:
   a first protective layer, arranged on the first surface of the chip, wherein the portion of the connection wire protruding in the direction away from the first surface is located inside the first protective layer; and
   a second protective layer, wherein a hardness of the second protective layer is larger than a hardness of the first protective layer,
   wherein the second protective layer is attached onto a surface of the first protective layer away from the chip, and an orthographic projection of the first protective layer onto the chip and an orthographic projection of the second protective layer onto the chip are completely overlapped; or
   wherein the first protective layer and the second protective layer are alternately arranged on the first surface of the chip, and a surface of the second protective layer away from the chip is located above a surface of the first protective layer away from the chip.

2. The camera module according to claim 1, wherein the second protective layer is made of ceramic material, silicon material, resin substrate material or epoxy glass fiber board material, and the first protective layer is a double-sided adhesive.

3. The camera module according to claim 1, further comprising:
   a second protective structure, arranged in the wiring region on the flexible circuit board, wherein a portion of the connection wire protruding in a direction away from a side surface of the chip is arranged inside the second protective structure.

4. The camera module according to claim 3, wherein a surface of the second protective structure away from the flexible circuit board and a surface of the first protective structure away from the chip are coplanar.

5. The camera module according to claim 1, wherein the number of the connection wire is plural, the first protective structure is formed as a frame-shaped structure on the first surface of the chip, and a portion of each connection wire protruding in a direction away from the first surface is located inside the first protective structure.

6. A mobile terminal, comprising the camera module according to claim 1.

7. A method for assembling a camera module, applied to the camera module according to claim 1, comprising:
   stacking the chip on the flexible circuit board;
   stacking the image sensor on the chip;
   connecting one end of the connection wire to the flexible circuit board and the other end of the connection wire to the first surface of the chip; and
   arranging the first protective structure on the first surface of the chip, to enable a portion of the connection wire protruding in a direction away from the first surface to be located inside the first protective structure.

8. The method for assembling a camera module according to claim 7, further comprising:
   injection-molding, with a plastic injection mold, a second protective structure onto the portion of the connection wire protruding in a direction away from a side surface of the chip, such that the second protective structure is connected to a surface of the flexible circuit board arranged with the chip, and a portion of the connection wire protruding in a direction away from the side surface of the chip is arranged inside the second protective structure.

9. The camera module according to claim 1, wherein the orthographic projection of the first protective layer onto the chip and an orthographic projection of the image sensor onto the chip have a predetermined distance, and the orthographic projection of the second protective layer onto the chip and the orthographic projection of the image sensor onto the chip have a predetermined distance.

* * * * *